US012568851B2

(12) United States Patent　　(10) Patent No.:　US 12,568,851 B2
Deneuville　　　　　　　　　　　　 (45) Date of Patent:　　　Mar. 3, 2026

(54) DEVICE OF ACQUISITION OF A 2D IMAGE AND OF A DEPTH IMAGE OF A SCENE

(71) Applicant: Commissariat á l'Énergie Atomique et aux Énergies Alternatives, Paris (FR)

(72) Inventor: François Deneuville, Grenoble (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 142 days.

(21) Appl. No.: 17/203,530

(22) Filed: Mar. 16, 2021

(65) Prior Publication Data

US 2021/0305206 A1　　　 Sep. 30, 2021

(30) Foreign Application Priority Data

Mar. 24, 2020　 (FR) ...................................... 2002838

(51) Int. Cl.
*H01L 25/04*　　　 (2023.01)
*H10F 39/00*　　　 (2025.01)
(52) U.S. Cl.
CPC ....... *H01L 25/043* (2013.01); *H10F 39/8067* (2025.01); *H10F 39/809* (2025.01); *H10F 39/811* (2025.01)
(58) Field of Classification Search
CPC ............. H01L 25/043; H01L 27/14629; H01L 27/14634; H01L 27/14636
See application file for complete search history.

(56) References Cited

U.S. PATENT DOCUMENTS 4,064,521 A * 12/1977 Carlson ............... H01L 21/0262
　　　　　　　　　　　　　　　　　　　　　　 136/258
9,142,583 B2 * 9/2015 Chang ................. H10F 39/8053
2013/0234029 A1 9/2013 Bikumandla
　　　　　　 (Continued)

FOREIGN PATENT DOCUMENTS

CN　　　 111354754　　 * 6/2020
CN　　　 111354754 A　 * 6/2020 ............ H10F 39/811
　　　　　　 (Continued)

OTHER PUBLICATIONS

Translation of Lee et al. (KR20110061677) (2011).*
Preliminary Search Report for French Application No. 2002838, dated Dec. 9, 2020.

*Primary Examiner* — Jay C Kim
*Assistant Examiner* — Woo K Lee
(74) *Attorney, Agent, or Firm* — Wolf, Greenfield & Sacks, P.C.

(57)　　　　　　 ABSTRACT

A device of acquisition of a 2D image and of a depth image, including: first sensor formed inside and on top of a first semiconductor substrate including a front surface and a rear surface, the first sensor including a plurality of 2D image pixels and a plurality of transmissive windows, each transmissive window including a portion of the first substrate and an amorphous silicon region in contact with the rear surface of said portion of the first substrate; and against the first sensor on the rear surface side of the first substrate, a second sensor formed inside and on top of a second semiconductor substrate and including a plurality of depth pixels arranged opposite the transmissive windows of the first sensor.

10 Claims, 7 Drawing Sheets

(56)         References Cited

U.S. PATENT DOCUMENTS

2013/0334640 A1 * 12/2013  Lee ................... H01L 27/14629
                                                      257/432
2015/0054962 A1    2/2015  Borthakur et al.
2019/0191067 A1 *  6/2019  Vaillant .............. H10F 39/8057

FOREIGN PATENT DOCUMENTS

EP        3 503 192 A1    6/2019
FR         2002838       12/2020
KR       20110061677    *  6/2011   ............ H04N 23/11

* cited by examiner

DEVICE OF ACQUISITION OF A 2D IMAGE AND OF A DEPTH IMAGE OF A SCENE

CROSS REFERENCE TO RELATED APPLICATIONS

This application claims priority to French patent application number 2002838, filed on Mar. 24, 2020, the contents of which is incorporated herein by reference in its entirety.

TECHNICAL BACKGROUND

The present application concerns image acquisition devices and, more particularly, image acquisition devices capable of acquiring a 2D image and a depth image of a scene

PRIOR ART

Image acquisition devices capable of acquiring depth information have been provided. For example, time-of-flight (ToF) detectors act to emit a light signal towards a scene, and then to detect the return light signal reflected by objects of the scene. By the time-of-flight calculation of the light signal, the distance between the acquisition device and objects in the scene can be estimated. As an example, the pixels of such a sensor may use SPAD-type photodiodes (single photon avalanche diodes).

In certain applications, it would be desirable to be able to capture both a 2D image of a scene and a corresponding depth image of the scene.

While a solution to achieve this object would be to use separate image sensors to capture the 2D image and the depth image, such a solution is not optimal due to the fact that the sensors will have different viewpoints on the scene, which results in a misalignment between the pixels of the corresponding images. Further, the use of two sensors would increase the bulk and the cost of the device.

Another solution would be to integrate the pixels of the 2D image and the depth pixels in a same array of detectors. However, a problem is that depth pixels generally have significantly larger dimensions than 2D image pixels and/or significantly higher power supply voltages than 2D image pixels, which complicates such an integration.

Patent application EP3503192 previously filed by the applicant describes a device of acquisition of a 2D image and of a depth image of a scene, this device comprising first and second stacked sensors, the first sensor comprising a plurality of 2D pixels and a plurality of transmissive windows, and the second sensor comprising a plurality of depth pixels respectively arranged opposite the transmissive windows of the first sensor.

It would be desirable to have a device of acquisition of a 2D image and of a depth image of a scene, such a device at least partially overcoming one or a plurality of the disadvantages of known devices.

SUMMARY

For this purpose, an embodiment provides a device of acquisition of a 2D image and of a depth image, comprising:

a first sensor formed inside and on top of a first semiconductor substrate comprising a front surface and a rear surface, the first sensor comprising a plurality of 2D image pixels and a plurality of transmissive windows, each transmissive window comprising a portion of the first substrate and an amorphous silicon region in contact with the rear surface of said portion of the first substrate; and against the first sensor on the rear surface side of the first substrate, a second sensor formed inside and on top of a second semiconductor substrate and comprising a plurality of depth pixels arranged opposite the transmissive windows of the first sensor.

According to an embodiment, the first sensor comprises, on the rear surface side of the first substrate, an interconnection stack having electric connection tracks and/or terminals formed therein.

According to an embodiment, in each transmissive window of the first sensor, the amorphous silicon region is arranged in an opening crossing the interconnection stack of the first sensor.

According to an embodiment, in each transmissive window of the first sensor, the amorphous silicon region extends across a thickness substantially equal to that of the interconnection stack of the first sensor and is flush with the surface of the interconnection stack of the first sensor opposite to the first semiconductor substrate.

According to an embodiment, in each transmissive window of the first sensor, the amorphous silicon region is laterally delimited, all over its periphery and along its entire height, by a dielectric material having a refraction index smaller than that of amorphous silicon.

According to an embodiment, in each transmissive window of the first sensor, the portion of the first substrate is laterally delimited, all along its periphery and along its entire height, by a wall made of a dielectric material having a refraction index smaller than that of the first semiconductor substrate.

According to an embodiment, in each transmissive window of the first sensor, the portion of the first semiconductor substrate and the amorphous silicon region have, in top view, substantially the same surface area.

According to an embodiment, the device further comprises, between each transmissive window of the first sensor and the corresponding depth pixel of the second sensor, an alternation of dielectric layers having distinct refraction indices, forming an antireflection stack for light rays crossing said transmissive window towards said depth pixel.

According to an embodiment, the second sensor comprises, on the rear surface side of the second semiconductor substrate, an interconnection stack having electric connection tracks and/or terminals formed therein.

According to an embodiment, each depth pixel of the second sensor comprises a SPAD-type photodiode.

According to an embodiment, each depth pixel of the second sensor comprises a plurality of memory areas coupled to a same detection area, and enables to measure a phase shift between an amplitude-modulated light signal, emitted by a light source of the device, and a light signal received by the photodetection area of the pixel, after reflection on a scene, an image of which is desired to be acquired.

According to an embodiment, the first semiconductor substrate is made of single-crystal silicon.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photodiodes and of the circuits for controlling the 2D image pixels and the depth pixels has not been detailed, the forming of such pixels being within the abilities of those skilled in the art based on the indications of the present description.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
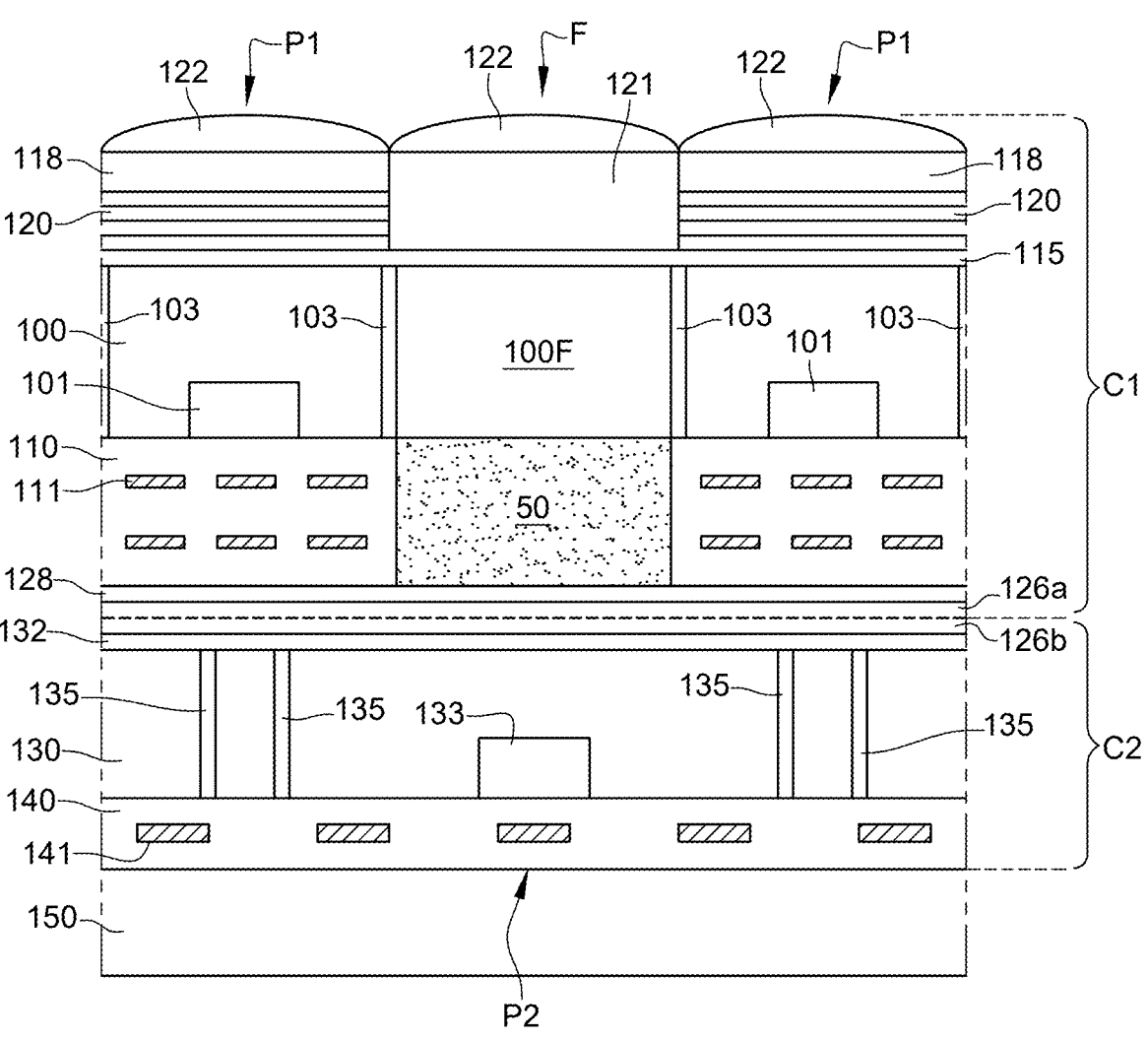
FIG. 1 is a cross-section view schematically and partially illustrating an embodiment of a device of acquisition of a 2D image and of a depth image.

FIG. 1 is a cross-section view schematically and partially illustrating an embodiment of a device of acquisition of a 2D image and of a depth image of a scene.

The device of FIG. 1 comprises:

a first sensor C1 formed inside and on top of a first semiconductor substrate 100, for example, a single crystal silicon substrate, sensor C1 comprising a plurality of 2D image pixels P1 and a plurality of windows F distributed across the sensor surface; and a second sensor C2 formed inside and on top of a second semiconductor substrate 130, for example, a single crystal silicon substrate, sensor C2 being placed against the back side of sensor C1 and comprising a plurality of pixels of depth P2 respectively arranged opposite windows F of sensor C1, each pixel of depth P2 comprising a SPAD-type photodiode.

It should be noted that in the present description, front side and back side of an element means the surface of the element intended to face the scene, an image of which is desired to be acquired, and the surface of the element opposite to its front side. In the example of FIG. 1, the front and back sides of the acquisition device are respectively its upper surface and its lower surface.

In practice, the device of FIG. 1 is intended to be used in combination with a light source, for example, a laser source, emitting light at a determined wavelength or in a determined wavelength range, preferably a narrow wavelength range, for example, a range having a width at half-maximum smaller than 3 nm, for example, a source having a central emission wavelength in the order of 940 nm. As an example, the emission wavelength range of the light source is located out of the visible range, for example, in near infrared, for example, in the range from 700 to 1,000 μm. In operation, the light signal generated by the light source is emitted towards the scene (for example, via one or a plurality of lenses), in the form of light pulses, for example, periodic pulses. The return light signal reflected by the scene is captured by depth pixels P2 of sensor C2, to measure the time of flight of the light signal at different points of the scene and deduce therefrom the distance to the acquisition device at different points of the scene. The pixels P1 of sensor C1 are capable of capturing the visible light emitted by the scene to form a 2D image of the scene. The windows F of sensor C1 are transmissive in the emission range of the light source to allow the detection of the return light signal by the depth pixels P2 of sensor C2. As an example, the transmission coefficient of the windows F of sensor C1 in the emission wavelength range of the light source is greater than 50%.

In the shown example, each pixel P1 of sensor C1 comprises a photodiode 101 comprising one or a plurality of local implanted regions formed in semiconductor substrate 100. In this example, the implanted regions of photodiode 101 are arranged on the rear surface side of substrate 100. Each pixel P1 may further comprise one or a plurality of additional components (not shown), for example, control transistors, formed on the rear surface side of substrate 100, for example, in substrate 100 and on the rear surface side of substrate 100. Sensor C1 further comprises an interconnection stack 110, formed of alternated dielectric and conductive layers coating the rear surface of substrate 100, where electric connection tracks and/or terminals 111 connecting pixels P1 of the sensor to a peripheral control and power supply circuit, not shown, are formed.

In the shown example, sensor C1 comprises vertical insulation walls 103 crossing substrate 100 across its entire thickness and delimiting substrate portions 100F respectively corresponding to the different windows F of sensor C1. Vertical insulating walls 103 particularly have an optical insulation function and may further have an electric insulation function. As an example, vertical insulating walls 103 are made of a dielectric material, for example, silicon oxide. Similar insulating walls may further be provided between the pixels P1 of sensor C1.

In the shown example, the substrate 100 of sensor C1 comprises no implanted region located in the substrate portions 100F of the windows F of sensor C1, to maximize the transparency of the substrate in windows F.

According to an aspect of the embodiment of FIG. 1, each transmissive window F further comprises, on the rear surface side of substrate 130, an amorphous silicon region 50 located opposite the substrate portion 100F of window F. Region 50 is in contact, by its front surface, with the rear surface of substrate portion 100F, and extends over substantially the entire surface of window F. In this example, interconnection stack 110 is interrupted opposite each transmissive window F. Amorphous silicon region 50 is located in the area of interruption of interconnection stack 110. Amorphous silicon region 50, for example, extends over substantially the entire thickness of interconnection stack 110. The thickness of amorphous silicon region 50 is for example substantially identical to that of interconnection stack 110, for example, in the range from 3 to 15 μm, for example, from 5 to 10 μm.

Preferably, amorphous silicon region 50 is in contact, all along its periphery and along substantially its entire height, with a material having a refraction index smaller than that of amorphous silicon, for example, silicon oxide. Thus, the light originating from the substrate portion 100F of window F is vertically guided towards the underlying pixel P2.

The thickness of substrate 100 is for example in the range from 2 to 10 µm, for example, from 3 to 5 µm.

Each window F for example has, in top view, dimensions substantially identical to the dimensions of the pixels P1 of sensor C1. As an example, in top view, the largest dimension of each pixel P1 or window F of sensor C1 is smaller than 10 µm, for example, smaller than 5 µm, for example, smaller than 2 µm, for example, in the order of 1 µm.

In the shown example, the front surface of substrate 100 is coated with a passivation layer 115, for example, a silicon oxide layer, a $HfO_2$ layer, a $Al_2O_3$ layer, or a stack of a plurality of layers of different materials capable of having other functions than the passivation function alone (antireflection, filtering, bonding, etc.), extending across substantially the entire surface of the sensor. As an example, layer 115 is arranged on top of and in contact with the front surface of substrate 100.

In the example of FIG. 1, sensor C1 is a 2D color image sensor, that is, it comprises pixels P1 of different types, capable of measuring light intensities in different visible wavelength ranges. For this purpose, each pixel P1 comprises a color filter 118, for example, a colored resin layer, arranged on the front surface side of substrate 100. As an example, sensor C1 comprises three types of pixels P1, first pixels P1 called blue pixels, comprising a color filter 118 preferably transmitting blue light, second pixels P1 called red pixels, comprising a color filter 118 preferably transmitting red light, and third pixels P1 called green pixels, comprising a color filter 118 preferably transmitting green light. In FIG. 1, the different types of pixels P1 are not differentiated.

In the example of FIG. 1, each pixel P1 further comprises an infrared band-stop filter 120, for example, an interference filter. Filter 120 is for example adapted to transmitting light at all wavelengths except for a wavelength range centered on the emission wavelength range of the light source. In this example, filter 120 is arranged on the front surface side of substrate 100, for example, on top of and in contact with the front surface of passivation layer 115, and extends over substantially the entire surface of each pixel P1. Color filter 118 is for example arranged on top of and in contact with the front surface of filter 120. Filter 120 enables to avoid for the light originating from the light source and reflected by the scene to be detected by pixels P1 and to degrade the quality of the 2D image acquired by pixels P1. Filter 120 more generally enables to block infrared radiations to improve the color rendering of the 2D image.

As a variant, sensor C1 may be a monochromatic 2D image sensor, in which case filters 118 may be omitted.

In the shown example, each window F of sensor C1 comprises a filter 121, for example, a resin filter and/or an interference filter, capable of transmitting light in the emission wavelength range of the light source. Preferably, filter 121 is capable of only transmitting light in a relatively narrow wavelength band centered on the emission wavelength range of the light source of the system, for example, a wavelength range having a full width at half-maximum smaller than 30 nm, for example, smaller than 20 nm, for example, smaller than 10 nm. In this example, filter 121 is arranged on the front surface side of substrate 100, for example, inside of and in contact with the front surface of passivation layer 115, and extends across substantially the entire surface of window F. Filter 121 enables to avoid unwanted startings of the photodiode of underlying pixel P2 under the effect of a light radiation which does not originate from the light source of the system. In the example of FIG. 1, filter 121 is located at the level of the windows F of the sensor only.

Each pixel P1 of sensor C1 may further comprise a microlens 122 arranged on the front surface side of substrate 100, for example on top of and in contact with the color filter 118 of the pixel, capable of focusing the incident light onto the pixel photodiode 101.

Further, each window F of sensor C1 may comprise a microlens 122, arranged on the front surface side of substrate 100, for example, on top of and in contact with the filter 120 of the window.

In this example, the rear surface of sensor C1 is bonded to the front surface of sensor C2 by molecular bonding. For this purpose, sensor C1 comprises a layer 126a, for example, made of silicon oxide, coating its rear surface. Further, sensor C2 comprises a layer 126b of same nature as layer 126a, for example, of silicon oxide, coating its front surface. The rear surface of layer 126a is placed into contact with the front surface of layer 126b to perform a molecular bonding of sensor C2 to sensor C1. As an example, layer 126a, respectively 126b, extends continuously over substantially the entire surface of sensor C1, respectively C2.

In the shown example, sensor C1 further comprises, on its rear surface side, between interconnection stack 110 and layer 126a, a layer 128 of a material having a refraction index different from that of layers 126a and 126b, for example, a material having a refraction index greater than that of layers 126a and 126b, for example, silicon nitride. As an example, layer 128 continuously extends over substantially the entire surface of sensor C1. Layer 126a is for example in contact, by its front surface, with the rear surface of layer 128.

Further, in this example, sensor C2 further comprises, on its front surface side, between substrate 130 and layer 126b, a layer 132 of a material having a refraction index different from that of layers 126a and 126b, for example, a layer made of the same material as layer 128, for example, silicon nitride. As an example, layer 132 continuously extends over substantially the entire surface of sensor C2. Layer 126b is for example in contact, by its rear surface, with the front surface of layer 132.

In this example, the stack of layers 128-126a, 126b-132 forms an antireflection stack favoring the passage of light from each transmissive window F of sensor C1 to the photosensitive region of the underlying pixel P2. The thickness of layers 128, 126a, 126b, 132 may be selected according to the emission wavelength of the light source, to favor the anti-reflection function of the stack at the emission wavelength of the light source, for example, so that the reflection coefficient of the stack at the emission wavelength of the light source is smaller than 6%. As a non-limiting example, for a 940-nm operating wavelength of the light source and in the case where layers 128 and 132 are made of silicon nitride and layers 126a and 126b are made of silicon oxide, layers 128 and 132 may each have a thickness in the order of 119 nm, and the sum of the thicknesses of layers 126a and 126b may be in the order of 200 nm.

Each pixel P2 of sensor C2 comprises a SPAD-type photodiode 133 formed in substrate 130, opposite the corresponding window F of sensor C1. Photodiode 133 comprises one or a plurality of semiconductor regions formed in semiconductor substrate 130. Each pixel P2 may further comprise one or a plurality of additional components (not shown), for example, control transistors, formed on the rear surface side of substrate 130, for example, in substrate 130 and on the rear surface of substrate 130. Sensor C2 further comprises an interconnection stack 140, formed of alternated dielectric and conductive layers coating the rear surface of substrate 130, having electric connection tracks and/or terminals 141 connecting pixels P2 of the sensor to a peripheral control and power supply circuit, not shown, formed therein.

A SPAD photodiode is essentially formed by a reverse PN junction, reverse-biased at a voltage higher than or equal to its avalanche threshold. When no electric charge is present in the depletion area or space charge area of the PN junction, the photodiode is in a non-conductive pseudo-steady state. When a photogenerated electric charge is injected into the depletion area, if the displacement speed of this charge in the depletion area is sufficiently high, that is, if the electric field in the depletion area is sufficiently intense, the photodiode is capable of avalanching. A single photon is thus capable of generating a measurable electric signal, and this, with a very short response time, which is particularly adapted to the time-of-flight measurements which are desired to be performed. Most known SPAD photodiode structures may be used in sensor C2 of FIG. 1, for example structures with a planar surface PN junction, structures with a planar buried PN junction, or also structures with a planar vertical PN junction, for example, such as described in French patent application Nr. 16/58513 filed on Sep. 13, 2016 and in the corresponding PCT application Nr. PCT/FR2017/052406 filed on Sep. 11, 2017 (B15154/DD17140). The provision of SPAD photodiodes with vertical PN junctions, for example, such as described in the above-mentioned French and PCT applications, advantageously enables to limit the active surface area of detection of pixels P2. This enables for the dimensions, in top view, of pixels P2, and accordingly of windows F, to be relatively small, for example, of the same order as the dimensions of pixels P1, and thus to limit the resolution loss in the 2D image resulting from the presence of windows F.

In the shown example, in each pixel P2 of sensor C2, photodiode 133 of the pixel is totally surrounded with a vertical insulating wall 135 crossing substrate 130 across its entire thickness. Wall 135 particularly has an optical insulation function and may further have an electric insulation function. As an example, vertical insulating wall 135 is made of a dielectric material, for example, silicon oxide. As a variant, vertical insulating wall 135 is a multilayer wall comprising an inner layer made of a dielectric material, for example, silicon oxide, one or a plurality of intermediate layers comprising at least one metal layer, and an outer layer made of a dielectric material, for example, silicon oxide.

In the shown example, the lateral dimensions of the detection areas of pixels P2 (delimited by walls 135) are greater than the lateral dimensions of transmissive windows F, which enables to release the alignment constraints on assembly of sensors C1 and C2. The described embodiments are however not limited to this specific case. As a variant, the lateral dimensions of the photosensitive regions of the detection areas of pixels P2 are substantially identical to those of transmissive windows F. In this case, vertical insulating wall 135 may be located substantially vertically in line with the vertical insulating wall 103 surrounding the substrate portion 100 of the corresponding window F of sensor C1.

Walls 103 and 135, as well as the vertical guiding through amorphous silicon region 50, enable to limit the risk for light rays received by a pixel P1 close to window F to activate the SPAD photodiode of the corresponding pixel P2, which might result in an erroneous depth measurement.

It should be noted that a SPAD-type photodiode is generally associated with secondary circuits, particularly a circuit for biasing its PN junction to a voltage greater than its avalanche threshold, a readout circuit capable of detecting that an avalanche of the photodiode has been started, as well as a quenching circuit having the function of interrupting the avalanche of the photodiode once it has been started. Such secondary circuits have not been shown in the drawings and will not be detailed, the described embodiments being compatible with the secondary circuits equipping known SPAD photodiodes. The secondary circuits may for example be at least partly arranged inside and on top of the rear surface of the portions of substrate 130 located outside of the vertical insulating walls 135 of the pixels.

Although this is not shown in FIG. 1, sensor C2 may further, as a variant, comprise a metal shield substantially coating the entire front surface of substrate 130, except for the portions of substrate 130 located inside of walls 135 (corresponding to the photodetection areas of pixels P2). The metal shield is for example arranged between substrate 130 and dielectric layer 132. Here again, the function of metal shield is an optical insulation function, aiming at avoiding for light rays received by a pixel P1 close to window F to activate the SPAD photodiode of the corresponding pixel P2. As a variant, the metal shield is not continuous but is formed of a plurality of separate rings respectively surrounding, in top view, the photodetection areas of the different pixels P2 of the sensor. An advantage is that this enables to limit parasitic light reflections by the metal shield towards the pixels P1 of sensor C1.

The thickness of substrate 130 is for example in the range from 5 to 50 μm, for example, from 8 to 20 μm.

It should be noted that the arrangement of sensors C1 and C2 of the device of FIG. 1 is advantageous in that the interconnection stack 140 of sensor C2 is located on the side of the sensor substrate 130 opposite to sensor C1. Indeed, a difficulty encountered when it is desired to co-integrate conventional photodiode pixels and SPAD photodiode pixels is that the power supply levels required by the two types of pixels are very different, which requires providing relatively bulky electric insulation elements between neighboring pixels of different types. In the example of FIG. 1, sensors C1 and C2 are naturally electrically insulated at the level of their respective pixel arrays, as well as at the level of their respective control/readout circuits. Due to the arrangement of interconnection stack 140 of sensor C2 on the side of substrate 130 opposite to sensor C1, risks of breakdown and/or of parasitic coupling due to the potential difference between the conductive power supply tracks of the pixels of sensor C1 and the conductive power supply tracks of the pixels of sensor C2 are avoided. As an example, in the device of FIG. 1, the power supply voltage of pixels P2 of sensor C2 is at least five times, or even ten times, greater than the power supply voltage of the pixels P1 of sensor C1.

In the shown example, sensor C2 is bonded, by its rear surface, to a support substrate 150, for example, a silicon substrate. As a variant, the support substrate may be replaced with an additional control and processing circuit (not shown) formed inside and on top of a third semiconductor substrate, for example, as described in relation with FIG. 1 of the above-mentioned patent application EP3503192.

FIGS. 2A to 2J are simplified cross-section view illustrating successive steps of a method of manufacturing the device of FIG. 1.

Figure 2A:
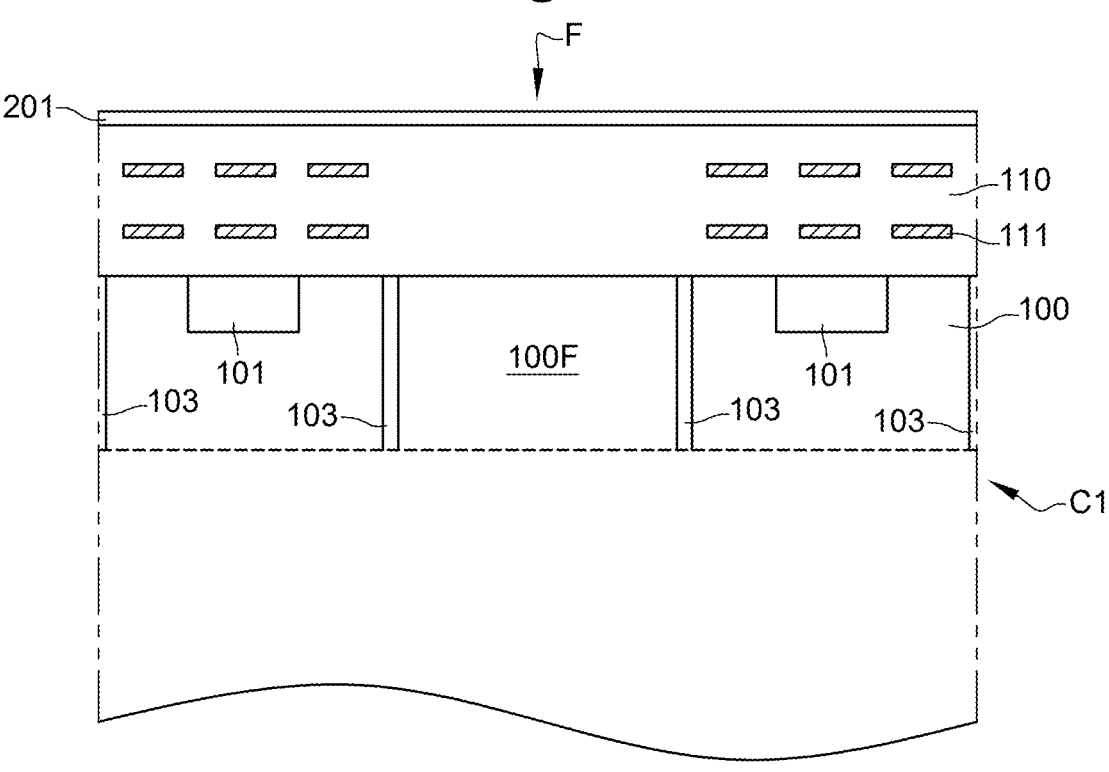
FIGS. 2A to 2J are cross-section views schematically illustrating steps of an example of a method of manufacturing a device of acquisition of a 2D image and of a depth image of the type described in relation with FIG. 1.

FIG. 2A illustrates an embodiment of the 2D image sensor C1 of the device of FIG. 1.

To form the sensor, it is started from a relatively thick semiconductor substrate 100, for example, having a thickness of several hundreds of micrometers.

The implanted regions of photodiodes 101 and of the possible components for controlling the pixels P1 of the sensor are formed from a first surface of the substrate, that is, its upper surface in the orientation of FIG. 2A. Vertical insulating walls 103 delimiting, in top view, the sensor windows F, are further formed from the upper surface of substrate 100.

The interconnection stack 110 of sensor C1 is then formed on the upper surface of substrate 100. In this example, as illustrated in FIG. 2A, the metal layers of interconnection stack 110 do not extend opposite the transmissive windows F of sensor C1.

In this example, an etch stop layer 201, for example, made of silicon nitride, is further deposited on the upper surface of interconnection stack 110.

Figure 2B:
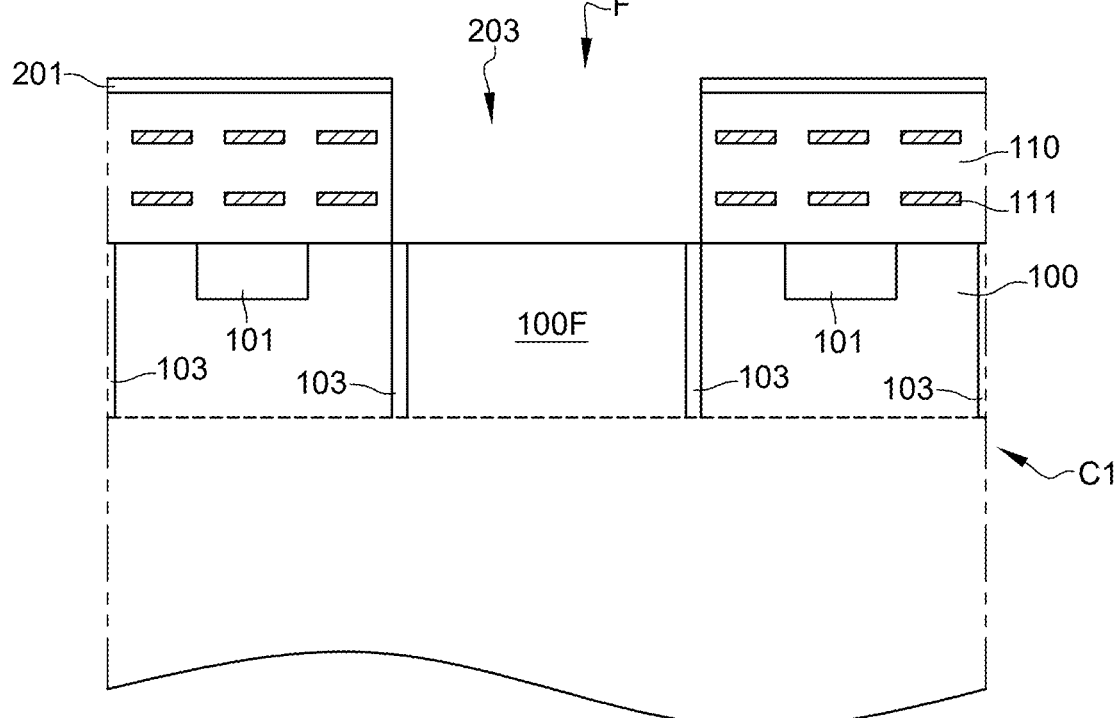

FIG. 2B illustrates a subsequent step of forming, from the upper surface of the structure, of an opening 203 vertically crossing layer 201 and interconnection stack 110, and emerging onto the upper surface of semiconductor substrate 100. The opening extends all over the surface of the transmissive window F of sensor C1. Opening 203 is for example formed by photolithography and etching.

Figure 2C:
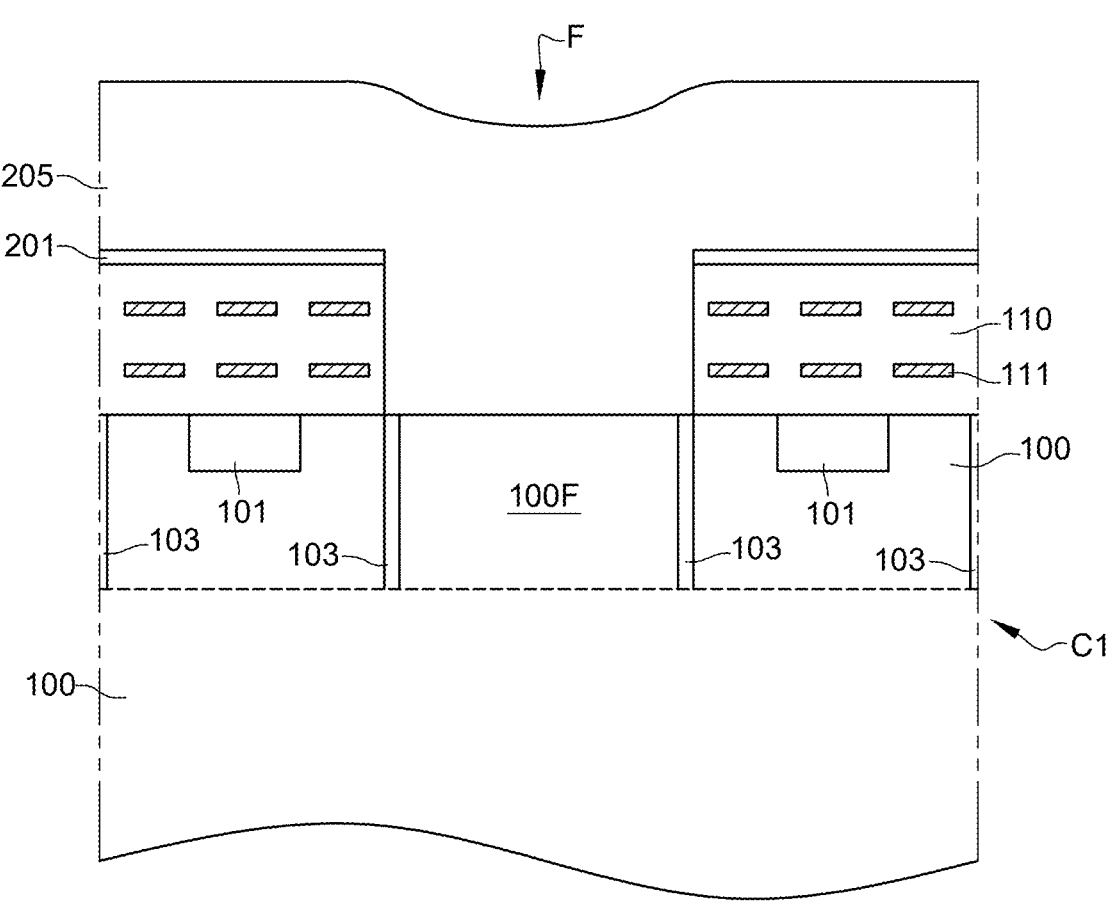
Figure 2D:
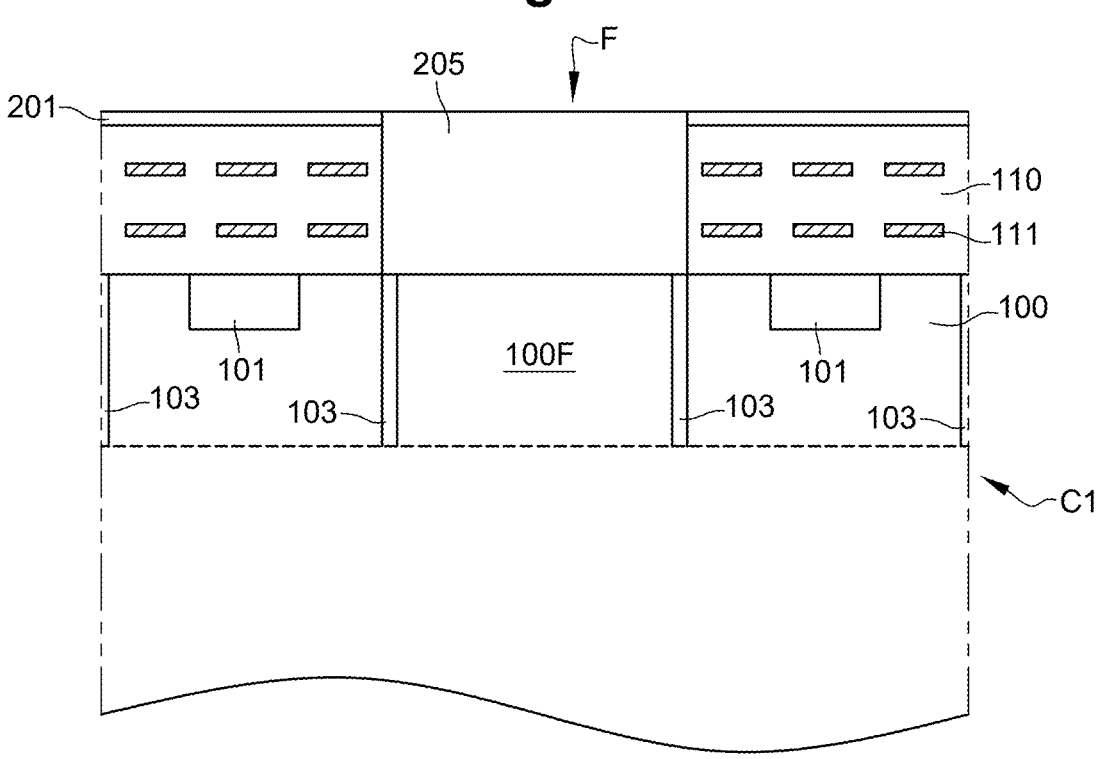
Figure 2E:
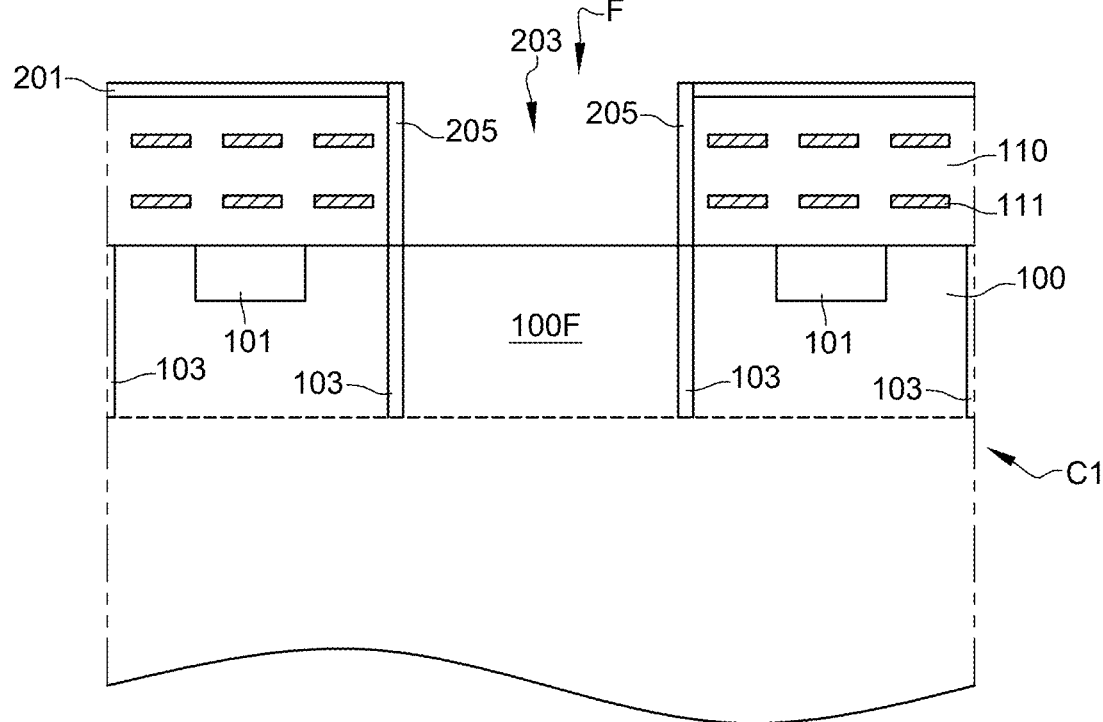

FIGS. 2C, 2D, and 2E illustrate optional steps of forming of a dielectric coating, for example, made of silicon oxide, on the lateral walls of opening 203.

FIG. 2C more particularly illustrates a step of deposition of a silicon oxide layer 205 having a thickness greater than the height of opening 203, entirely filling opening 203.

FIG. 2D illustrates subsequent step of planarization, for example, by CMP ("Chemical-Mechanical Polishing"), of the upper surface of layer 205. The planarization is interrupted at the level of stop layer 201. Thus, at the end of this step, layer 205 is removed everywhere except opposite transmissive windows F, the portions of layer 205 kept in the transmissive windows being flush with the upper surface of stop layer 201.

FIG. 2E illustrates a step of removal, at the level of each transmissive window F, of a central portion of the layer portion 205 located inside of opening 203. At the end of this step, only a peripheral region of layer 205 coating the lateral walls of opening 203 is kept. As an example, the layer portion 205 kept at this step coats the lateral walls of opening 203 over substantially the entire periphery and along substantially the entire height of opening 203. The removal of the central portion of layer portions 205 is for example performed by photolithography and etching. During this step, the access to the upper surface of semiconductor substrate 100 is freed opposite transmissive windows F. The layer portion 205 kept on the sides of opening 203 is intended to form a vertical wall for optically guiding the light crossing amorphous silicon region 50 (not shown in FIG. 2D) of transmissive window F. Guiding wall 205 is for example located vertically in line with the vertical wall 103 delimiting the substrate portion 100F of window F. As an example, in each transmissive window F, guiding wall 205 is in contact, by its lower surface, with the upper surface of wall 103.

Figure 2F:
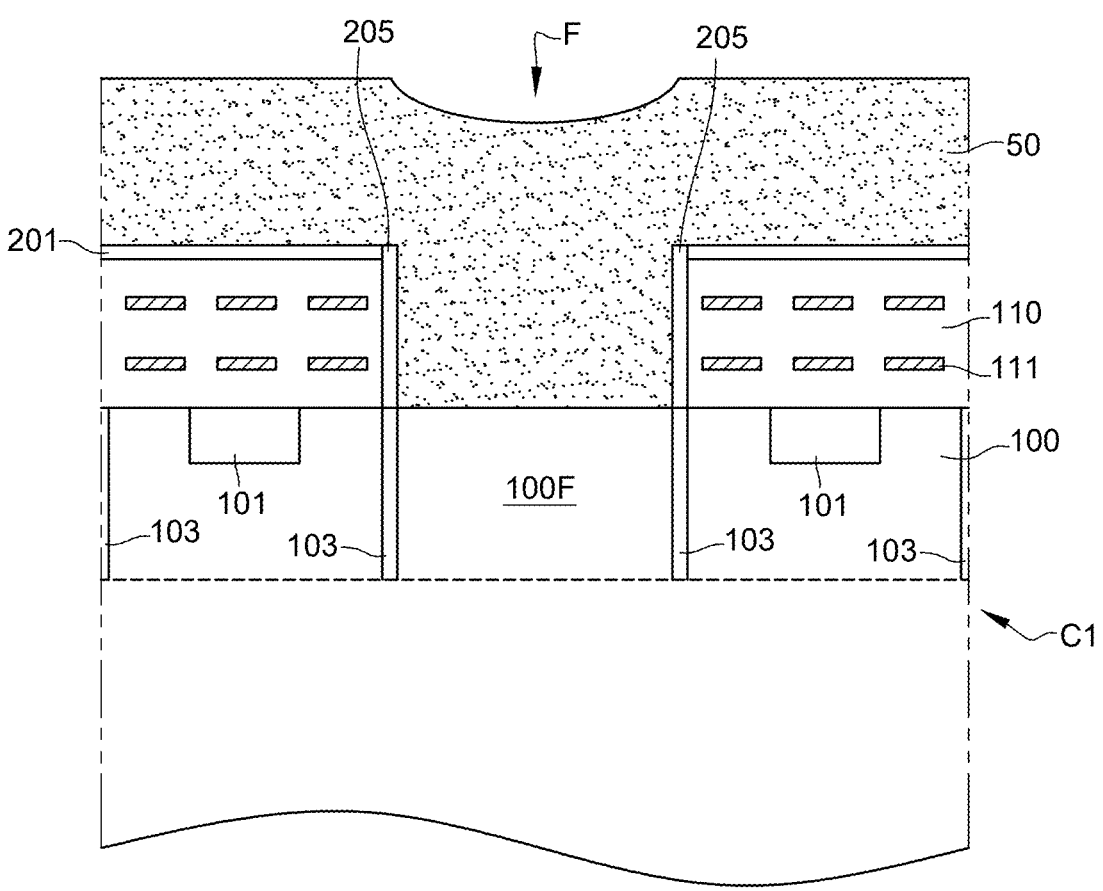
Figure 2G:
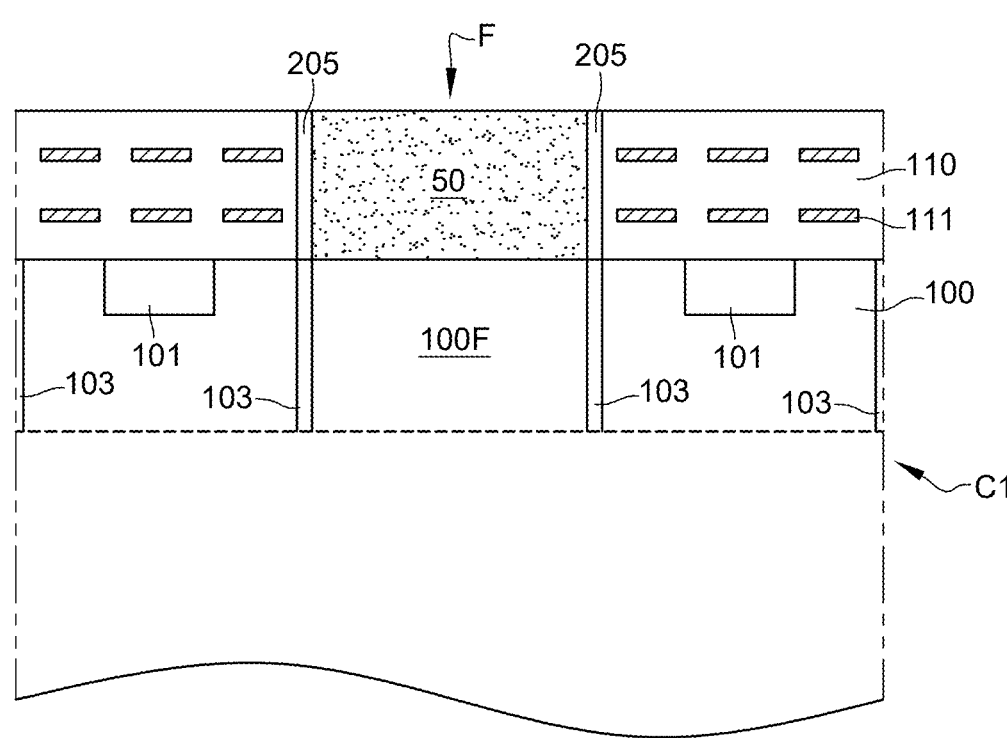

It should be noted that the steps of FIGS. 2C, 2D, and 2G may as a variant be omitted. In this case, the guiding of the light vertically crossing the amorphous silicon region 50 of each transmissive window is ensured, at the periphery of amorphous silicon region 50, by the dielectric material(s) forming interconnection stack 50.

In another variant, the vertical guiding wall may comprise a stack of a plurality of layers capable of including one or a plurality of metal layers. The forming of such a wall may comprise one or a plurality of steps of conformal deposition of said layers onto the lateral walls and onto the bottom of opening 203, and one or a plurality of vertical anisotropic etching steps aiming at keeping said layers only on the lateral walls of opening 203.

FIG. 2F illustrates a subsequent step of deposition of an amorphous silicon layer 50 having a thickness greater than the height of openings 203, entirely filling openings 203.

FIG. 2G illustrates a subsequent step of planarization, for example, by CMP, of the upper surface of layer 50. The planarization is interrupted after the removal of stop layer 201. Thus, at the end of this step, layer 50 is removed everywhere except opposite transmissive windows F, the portions of layer 50 kept in the transmissive windows being flush with the upper surface of stop layer 101.

Figure 2H:
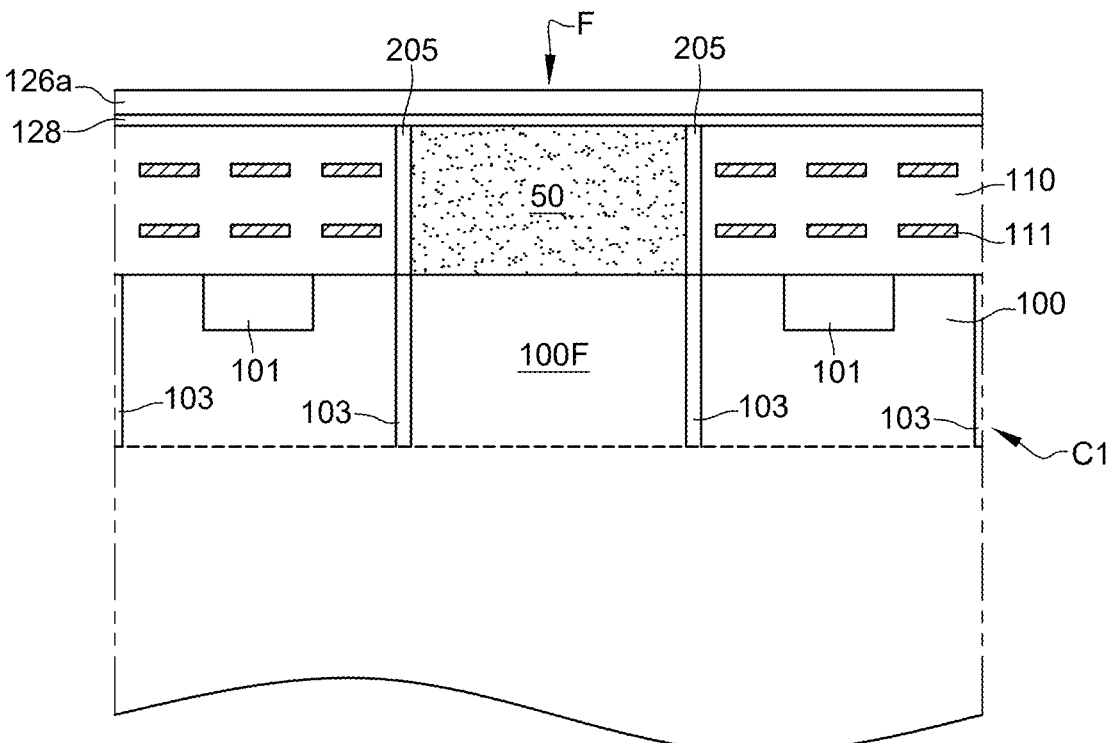

FIG. 2H illustrates a subsequent step of deposition of dielectric layer 128, followed by a step of deposition of the bonding layer 126a of sensor C1, on the upper surface side of interconnection stack 110. In this example, each of layers 128 and 126a extends continuously over the entire surface of sensor C1. More particularly, in this example, layer 128 is in contact, by its lower surface, with the upper surface of interconnection stack 110, of vertical guiding walls 205, and of amorphous silicon regions 50. Layer 126a is in contact, by its lower surface, with the upper surface of layer 128.

Figure 2I:
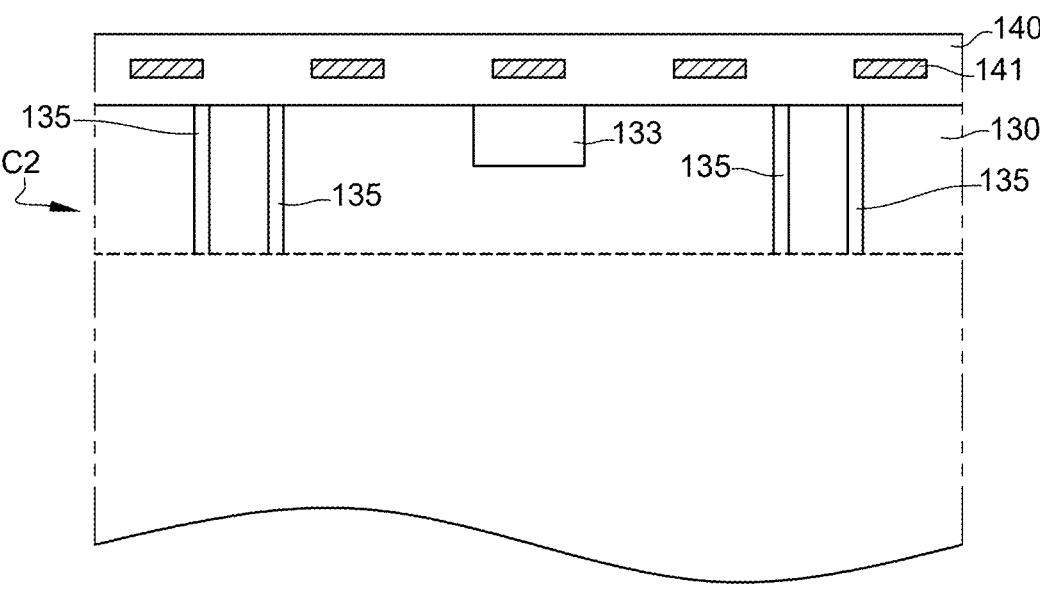

FIG. 2I illustrates a parallel step of forming of the device sensor C2.

To form the sensor, it is started from a relatively thick semiconductor substrate 130, for example, having a thickness of several hundreds of micrometers.

The implanted regions of photodiodes 133 and of the possible components for controlling the sensor pixels P2 are formed from a first surface of the substrate, that is, its upper surface in the orientation of FIG. 2I. Vertical insulating walls 135 laterally delimiting pixels P2 are further formed from the upper surface of substrate 130.

The SPAD photodiodes may for example be formed as described in relation with FIG. 3 of the above-mentioned application EP3503192, as well as in French applications Nr. 16/58513 and PCT Nr. PCT/FR2017/052406.

The interconnection stack 140 of sensor C2 is then formed on the upper surface of substrate 130.

Figure 2J:
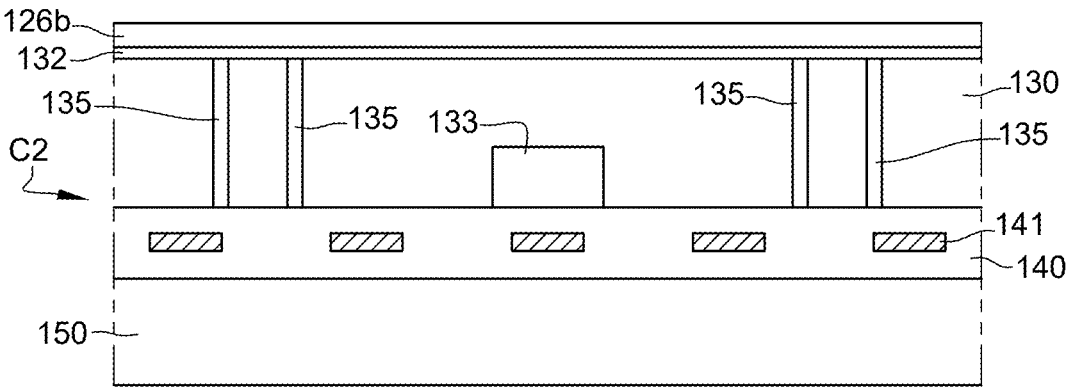

FIG. 2J illustrates a subsequent step of thinning of the substrate 130 of sensor C2, from its surface opposite to interconnection stack 140.

For this purpose, a support substrate 150 is bonded to the surface of interconnection stack 140 opposite to substrate 130. Substrate 130 is then thinned, for example, by grinding and/or CMP, from its surface opposite to interconnection stack 140, using support substrate 150 as a handle.

It should be noted that, in FIG. 2J, the orientation of sensor C2 is inverted with respect to FIG. 2I.

The thinning is interrupted at the level of the surface of vertical insulating walls 135 opposite to interconnection stack 140. In this example, at the end of the thinning step, walls 135 are flush with the surface of substrate 130 opposite to interconnection stack 140, that is, the upper surface of substrate 130 in the orientation of FIG. 2J.

FIG. 2J further illustrates a subsequent step of deposition of dielectric layer 132, followed by a step of deposition of the bonding layer 126*b* of sensor C2, on the upper surface of thinned substrate 130. In this example, each of layers 132 and 126*b* continuously extends over the entire surface of sensor C2. More particularly, in this example, layer 132 is in contact, by its lower surface, with the upper surface of thinned substrate 130 and of vertical insulating walls 135. Layer 126*b* is in contact, by its lower surface, with the upper surface of layer 132.

The next step of the method of manufacturing the device have not been shown, these steps being within the abilities of those skilled in the art based on the indications of the present description. Sensor C1 may be flipped and bonded to the upper surface of sensor C2, by direct bonding or molecular bonding of the surface of layer 126*a* opposite to substrate 100 onto the surface of layer 126*b* opposite to substrate 130. The substrate 100 of sensor C1 may then be thinned from its surface opposite to interconnection stack 110, for example, by grinding and/or CMP, using support substrate 150 as a handle. The thinning is for example interrupted at the level of the surface of vertical insulating walls 103 opposite to interconnection stack 110, so that, at the end of the thinning step, walls 103 are flush with the surface of substrate 100 opposite to interconnection stack 110. The upper elements of the device of FIG. 1, particularly layer 115, filters 120, 118, and 121, and microlenses 122, may then be formed on the side of the surface of substrate 100 opposite to interconnection stack 110.

In top view, the arrangement of the 2D pixels P1 and of the depth pixels P1 is for example identical or similar to what has been described in relation with FIG. 4 of the above-mentioned patent application EP3503192.

In the device of FIG. 1, depth pixels P2 can be individually controlled to generate a depth image having a resolution equal to the number of pixels P2 of sensor C2.

As a variant, pixels P2 may be coupled by blocks of a plurality of neighboring pixels, for example, blocks of three by three neighboring pixels P2 to form a photomultiplier, for example, of SIPM type. It is then provided to only retain the correlated events within each block. In other words, only the events simultaneously detected by a plurality of pixels in the block will be retained to construct the depth image. The resolution of the depth image is then smaller than the number of pixels P2 of sensor C2, but the immunity to noise of the depth image sensor is thereby improved.

Sensors C1 and C2 may be controlled separately. In particular, according to the considered application, the rate of acquisition of the 2D images by sensor C1 may be different from the rate of acquisition of the depth images by sensor C2.

Specific embodiments have been described. Various alterations and modifications will occur to those skilled in the art. In particular, embodiments where each depth pixel P2 of sensor C2 comprises a SPAD-type photodiode have been described hereabove. The described embodiments are however not limited to this specific case. As a variant, the depth pixel may be formed in any other technology adapted to the implementation of a measurement of the time of flight of a light signal emitted by a light source and reflected by the scene. As an example, the depth pixel may be a lock-in-type pixel, such as described in French patent applications Nr. 16/62341 and Nr. 16/62340 previously filed by the applicant, that is, a pixel comprising a plurality of memory areas coupled to a same detection area, and enabling to measure a phase shift between an amplitude-modulated light signal, emitted by the light source, and a light signal received by the photodetection area of the pixel, after reflection on the scene.

Further, it will be within the abilities of those skilled in the art to adapt the provided solution to the different examples of devices described in the above-mentioned patent application EP3503192, by replacing the optical elements 124, 124', or 124" of this document with amorphous silicon region 50.

The invention claimed is:

1. A device of acquisition of a 2D image and of a depth image, comprising:
a first sensor formed inside, on top of, and below a first semiconductor substrate comprising a front surface and a rear surface, the first sensor comprising a plurality of 2D image pixels and a plurality of transmissive windows, each transmissive window comprising a portion of the first semiconductor substrate and an amorphous silicon region in contact with the rear surface of said portion of the first semiconductor substrate; and against the first sensor on a rear surface side of the first semiconductor substrate, a second sensor formed inside, on top of, and below a second semiconductor substrate and comprising a plurality of depth pixels arranged opposite the transmissive windows of the first sensor,
wherein the first sensor comprises, on the rear surface side of the first semiconductor substrate, a first interconnection structure having electric connection elements,
wherein, in each transmissive window of the first sensor, said amorphous silicon region is arranged in an opening crossing the first interconnection structure of the first sensor,
wherein, in each transmissive window of the first sensor, the amorphous silicon region is laterally delimited and separated from the first interconnection structure of the first sensor least one vertical guiding wall coating a lateral side of the opening crossing the first interconnection structure of the first sensor,
and wherein the at least one vertical guiding wall comprises a vertical layer made of a dielectric material, said vertical layer being formed by conformal deposition of the dielectric material onto the lateral walls of the opening previously formed in the interconnection structure and later filled with amorphous silicon, an entire external surface of the dielectric vertical layer opposite to the amorphous silicon region being in contact with a dielectric surface of the first interconnection structure.

2. The device according to claim 1, wherein, in each transmissive window of the first sensor, said amorphous silicon region extends across a thickness equal to a thickness of the first interconnection structure of the first sensor and is flush with a surface of the first interconnection structure of the first sensor opposite to the first semiconductor substrate.

3. The device according to claim 1, wherein, in each transmissive window of the first sensor, the amorphous silicon region is laterally delimited by a dielectric material having a refraction index smaller than a refractive index of amorphous silicon along its periphery and its height.

4. The device according to claim 1, wherein, in each transmissive window of the first sensor, the portion of the first semiconductor substrate is laterally delimited, all along its periphery and along its entire length, by a wall made of a dielectric material having a refraction index smaller than a refractive index of the first semiconductor substrate.

5. The device according to claim 1, wherein, in each transmissive window of the first sensor, said portion of the first semiconductor substrate and said amorphous silicon region have, in top view, substantially the same surface area.

6. The device according to claim 1, further comprising, between each transmissive window of the first sensor and a corresponding depth pixel of the second sensor, an alternation of dielectric layers having distinct refraction indices, forming an antireflection stack for light rays crossing said transmissive window towards said corresponding depth pixel.

7. The device according to claim 1, wherein the second sensor comprises, on a rear surface side of the second semiconductor substrate, a second interconnection structure having electric connection tracks and/or terminals formed therein.

8. The device according to claim 1, wherein each depth pixel of the second sensor comprises a SPAD-type photo-diode.

9. A system comprising a device according to claim 1 and a light source, wherein each depth pixel of the second sensor comprises a plurality of memory areas coupled to a same detection area, and enables to measure a phase shift between an amplitude-modulated light signal, emitted by the light source of the device, and a light signal received by a pixel photodetection area, after reflection on a scene, an image of which is desired to be acquired.

10. The device according to claim 1, wherein the first semiconductor substrate is made of single-crystal silicon.

\* \* \* \* \*